(12) United States Patent
Ayazi et al.

(10) Patent No.: US 7,812,692 B2
(45) Date of Patent: *Oct. 12, 2010

(54) PIEZO-ON-DIAMOND RESONATORS AND RESONATOR SYSTEMS

(75) Inventors: Farrokh Ayazi, Atlanta, GA (US); Reza Abdolvand, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 198 days.

This patent is subject to a terminal disclaimer.

(21) Appl. No.: 11/809,748

(22) Filed: Jun. 1, 2007

(65) Prior Publication Data

US 2008/0297281 A1 Dec. 4, 2008

(51) Int. Cl.
*H03H 9/00* (2006.01)
*H03H 9/09* (2006.01)
*H01L 41/047* (2006.01)

(52) U.S. Cl. ..................... 333/187; 310/321
(58) Field of Classification Search ............. 333/187, 333/188, 189, 190, 191, 192; 310/321
See application file for complete search history.

(56) References Cited

U.S. PATENT DOCUMENTS

| | | | |
|---|---|---|---|
| 5,640,133 A | 6/1997 | MacDonald et al. | |
| 6,437,484 B1 * | 8/2002 | Nishimura et al. | 310/324 |
| 6,842,088 B2 * | 1/2005 | Yamada et al. | 333/187 |
| 6,909,221 B2 | 6/2005 | Ayazi et al. | |
| 7,023,065 B2 | 4/2006 | Ayazi et al. | |
| 7,212,082 B2 * | 5/2007 | Nagao et al. | 333/187 |
| 7,492,241 B2 | 2/2009 | Piazza et al. | |
| 2008/0078233 A1 * | 4/2008 | Larson et al. | 73/24.04 |
| 2008/0079515 A1 | 4/2008 | Ayazi et al. | |
| 2009/0072663 A1 | 3/2009 | Ayazi et al. | |

FOREIGN PATENT DOCUMENTS

| | | | |
|---|---|---|---|
| DE | 10 2006 057 730 | * | 6/2007 |
| JP | 10-209794 | * | 8/1998 |

OTHER PUBLICATIONS

Loschonsky et al., Mass Sensitive Thin Film Bulk Acoustic Wave Resonators, Jun. 2006, IEEE, pp. 111-116.*
T. Uemura, et al. "Low loss diamond SAW devices by small grain size poly-crystalline diamond," Proceedings Ultrasonics Symposium, vol. 1, 2002, pp. 431-434.
S. Humad, et al., "High frequency micromechanical piezo-on-silicon block resonators," Technical Digest IEEE International Electron Devices Meeting (IEDM '03), 2003, pp. 39.3.
Z. Hao, et al., "A High-Q Length-Extensional Bulk-Mode Mass Sensor with Annexed Sensing Platforms," Tech. Dig IEEE MEMS '06 Conf., pp. 598-601, 2006.

(Continued)

*Primary Examiner*—Dean O Takaoka
(74) *Attorney, Agent, or Firm*—Thomas, Kayden, Horstemeyer & Risley, LLP

(57) ABSTRACT

Disclosed are piezoelectrically-transduced micromachined bulk acoustic resonators fabricated on a polycrystalline diamond film deposited on a carrier substrate. Exemplary resonators comprise a substrate having a smooth diamond layer disposed thereon. A piezoelectric layer is disposed on the diamond layer and top and bottom electrodes sandwich the piezoelectric layer. The resonant structure comprising the diamond layer, piezoelectric layer and electrodes are released from the substrate and are free to vibrate. Additionally, one or more sensing platforms may be coupled to the substrate to form a mass sensor.

24 Claims, 8 Drawing Sheets

OTHER PUBLICATIONS

J. Wang, et al., "1.51-GHz nanocrystalline diamond . . . with material-mismatched isolating support," IEEE Int. Conf. of Micro Electro Mechanical Systems (MEMS '04), Jan. 2004, pp. 641-644.

G. Piazza, et al., "Voltage-Tunable piezoelectrically-transduced . . . resonators on SOI substrate," IEEE Int. Conf. on Micro Electro mechanical Systems (MEMS '03), Jan. 2003, pp. 149-152.

Devoe, "Piezoelectric Thin Film Micromechanical Beam Resonators," Sensors and Actuators, Jan 2001, vol. 88, Issue 3, pp. pp. 263, 272.

G. Piazza, et al., " Low motional . . . piezoelectric micromechanical resonators for UHF applications." IEEE Int. Conf. on Micro Electro Mechanical Systems (MEMS '05), Jan. 2005, pp. 20-23.

Brett Piekarski, et al., "Surface micromachined piezoelectric resonant beam filters,", Sensors and Actuators, Jul. 2001, vol. 91, Issue 3, pp. 313-320.

G. Piazza, et al., "Voltage-Tunable piezoelectrically-transduced single-crystal silicon micromechanical resonators," Sensors and Actuators, Mar. 2004, vol. 111, Issue 1, pp. 71-78.

* cited by examiner

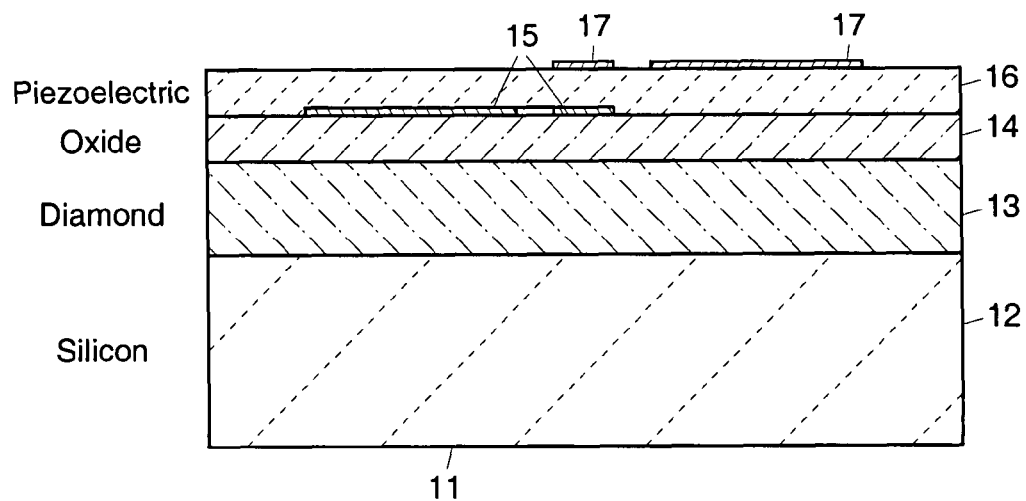
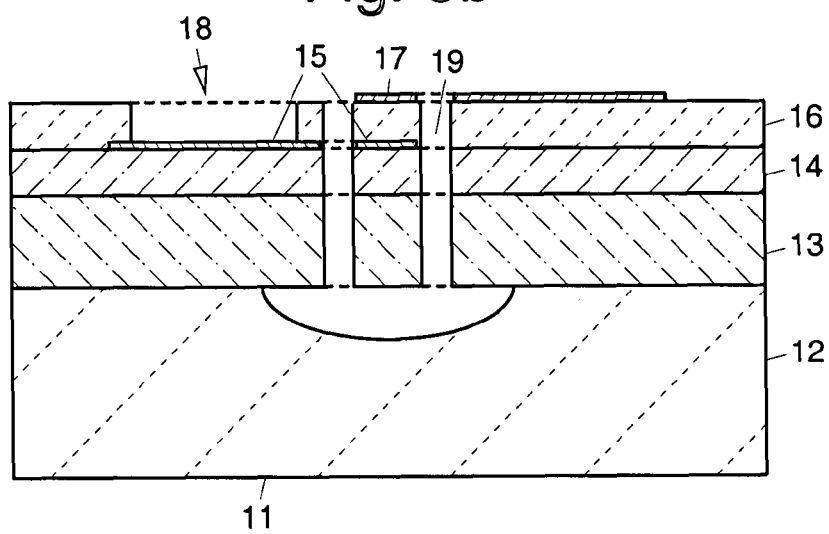

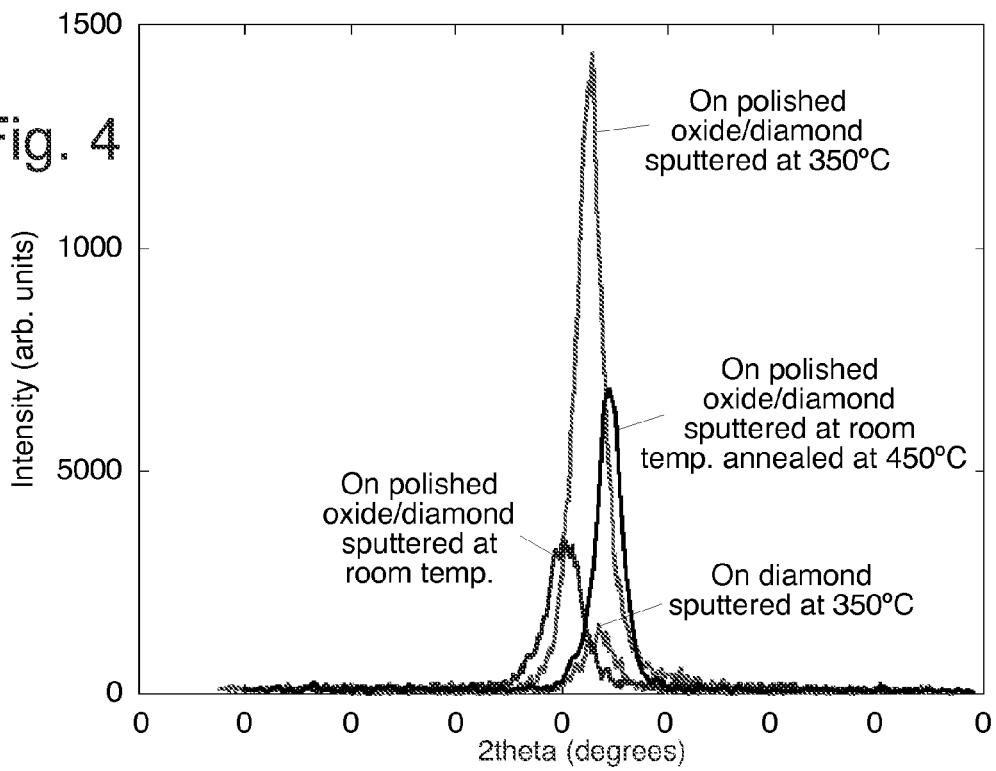
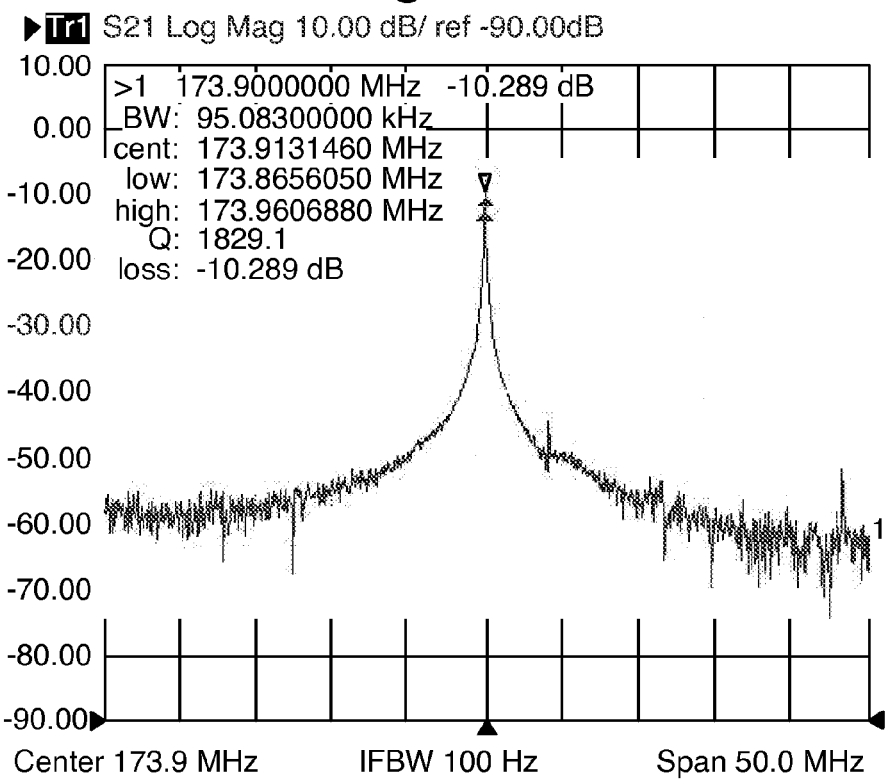

PIEZO-ON-DIAMOND RESONATORS AND RESONATOR SYSTEMS

STATEMENT REGARDING FEDERALLY SPONSORED RESEARCH OR DEVELOPMENT

This invention was made with government support under agreement ECS-0348286, awarded by the National Science Foundation. The Government has certain rights in this invention.

BACKGROUND

The present invention relates generally to resonator systems, and more particularly, to piezoelectrically-transduced polycrystalline diamond micromachined resonators and coupled resonator systems that may be used in RF oscillator, bandpass frequency filter and mass sensing applications.

Nanocrystalline diamond (NCD) is an emerging material with growing applications in MEMS driven by its superior mechanical properties such as high acoustic velocity, low acoustic loss, chemical stability, and very low wear rate. The use of polycrystalline diamond as an acoustic media for surface acoustic wave (SAW) devices has proven unparalleled in increasing the frequency of operation while relaxing the requirement on the lithographic resolution. See for example, T. Uemura, et al. "Low loss diamond SAW devices by small grain size poly-crystalline diamond," *IEEE Ultrasonics Symposium Proceedings*, vol. 1, 2002, pp. 431-434. Capacitively transduced diamond disk resonators have also been showcased at GHz frequencies, increasing the resonance frequency by a factor of 2 compared to the same size resonators made of polysilicon. See for example, J. Wang, et al., "1.51-GHz nanocrystalline diamond micromechanical disk resonator with material-mismatched isolating support," *IEEE International Conference on Micro Electro Mechanical Systems (MEMS '04)*, 2004, pp. 641-644. However, very high motional impedance of these capacitive devices limits their system-level applications as they are required to interface with low impedance radio frequency (RF) electronics. A resonator with high impedance introduces excessive loss when used in a filter and requires multiple gain stages to sustain oscillation in an oscillator circuit, increasing the power consumption and design complexity.

Thin-film piezoelectric-on-silicon (TPoS) composite bulk acoustic resonators (CBAR) were initially introduced by the present inventors to tackle the high motional impedance problem in micromachined resonators while preserving high quality factors and frequencies. This is discussed by S. Humad, et al., in "High frequency micromechanical piezo-on-silicon block resonators," *Technical Digest of the IEEE International Electron Devices Meeting (IEDM '03)*, 2003, pp 39.3.1-39.3.4 and G. Piazza, et al., in "Voltage-tunable piezoelectrically-transduced single-crystal silicon resonators on SOI substrate," *IEEE International Conference on Micro Electro Mechanical Systems (MEMS '03)*, 2003, pp. 149-152, for example.

The large electro-mechanical coupling coefficient in a piezoelectrically-transduced resonator can potentially provide orders of magnitude lower motional impedance compared to a capacitive resonator at the same frequency. The underlying structural material in these devices improves the energy density, structural integrity, and resonance frequency.

Single crystal silicon resonators have previously been developed by the present inventors and others. Various references discuss resonator devices including U.S. Pat. No. 7,023,065, issued to Ayazi, et al. entitled "Capacitive Resonators and Methods of Fabrication," U.S. Pat. No. 6,909,221 issued to Ayazi, et al. entitled "Piezoelectric on semiconductor-on-insulator microelectromechanical resonators," a paper by Devoe entitled "Piezoelectric Thin Film Micromechanical Beam Resonators," Sensors and Actuators, A 88; 2001 pp. 263-272, a paper by Piazza, et al. entitled "Voltage-Tunable Piezoelectrically-Transduced Single-Crystal Silicon Resonators on SOI Substrate," in *Proc. of the IEEE International Conference on Micro Electro Mechanical Systems (MEMS '03)*, Koyoto, Japan, January 2003, and a paper by Humad, et al. entitled "High Frequency Micromechanical Piezo-On-Silicon Block Resonators," *Technical Digest of the IEEE International Electron Devices Meeting (IEDM '03)*; 2003, pp 39.3.1-39.3.4. However, there are no known references relating to piezoelectrically-transduced micromachined bulk acoustic resonators fabricated on a polycrystalline diamond film deposited on a carrier wafer.

Quartz crystal microbalance (QCM) mass sensors have found many applications in chemical and biological sensors. However, their relatively large size can limit the extent in which QCM sensors are used in microsystems to detect small traces of chemical or biochemical agents. In applications for which an array of mass sensitive sensors is required to distinguish between various types of molecules, QCM sensors fail to offer a compact and cost effective solution.

In recent years, micromachined resonant mass sensors with a much smaller form-factor have attracted a lot of attention to fill in the gap for arrayed and/or implantable gravimetric bio/chemical sensors. Cantilever beams and thin film bulk acoustic resonators are amongst the more successful realizations of micromachined mass sensors. Higher frequency of operation can potentially improve the sensitivity of these devices compared to QCM sensors, if high quality factors are maintained. Sensitivity to environmental parameters (e.g., temperature) is also an issue that needs to be addressed in order to facilitate robust operation of micromachined mass sensors. Complex actuation and readout mechanism is another bottleneck hindering widespread use of these devices in microsystems.

Capacitively-transduced lateral bulk acoustic resonant sensors have been developed by the present inventors in an effort to address some of the issues associated with micromachined mass sensors. See, for example, Z. Hao, R. Abdolvand and F. Ayazi, "A High-Q Length-Extensional Bulk-Mode Mass Sensor with Annexed Sensing Platforms," *IEEE International Conference on Micro Electro Mechanical Systems (MEMS '06)*, pp. 598-601, 2006. These devices demonstrated relatively high Q values in air at ~12 MHz while minimizing the change in the effective stiffness of the structure imposed by absorbed mass. However, to increase the sensitivity, the device dimension needed to be scaled down, resulting in a reduced capacitive transduction area. Therefore, motional impedance of the device will increase, which translates to high power consumption and higher phase noise when interfaced with an oscillator circuit. More importantly, small capacitive air gaps are prone to blockage and squeeze film damping when exposed to environment.

It would be desirable to have piezoelectrically-transduced polycrystalline diamond micromachined resonator structures that may be used in RF oscillator, bandpass frequency filter and mass sensing applications, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 3a and 3b show a simple flow diagram that illustrates an exemplary fabrication process flow for making an exemplary piezoelectric-on-diamond resonator;

FIG. 4 shows x-ray diffraction (XRD) 2θ plots measured from ZnO sputtered samples on different substrates with various sputtering parameters;

FIG. 5 shows a frequency response plot of a $3^{rd}$ order resonator with a 40 μm finger pitch;

DETAILED DESCRIPTION

Figure 1:
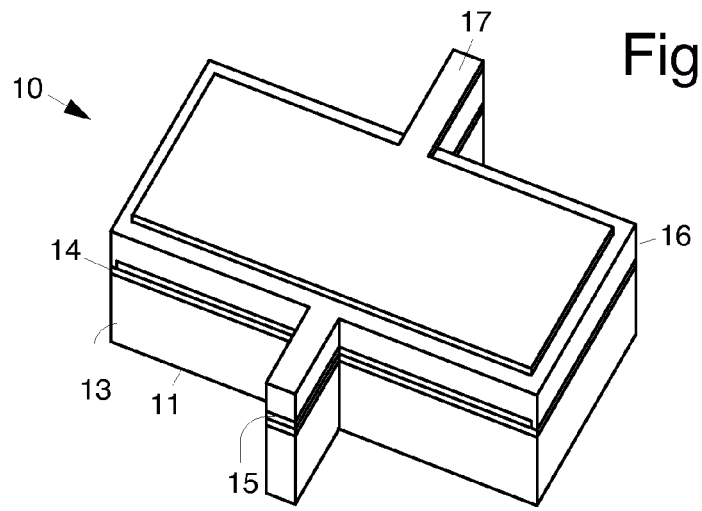
FIG. 1 illustrates an exemplary piezoelectric-on-diamond resonator.

Disclosed is a new class of piezoelectrically-transduced micromachined bulk acoustic resonators fabricated on a polycrystalline diamond film deposited on a carrier wafer or substrate. These devices benefit from the large elastic modulus of diamond (the largest in nature). Consequently, the resonator can reach very high resonance frequencies while the frequency-determining dimension of the device stays in a range, comfortably feasible to fabricate using conventional photolithography and etching tools.

The inherently high electromechanical coupling factor of the piezoelectric transducers results in low motional impedance resonators which are much easier to be interfaced with electronics. The lateral dimension of the resonating structure can be changed in order to alter the resonance frequency of the device. This feature enables realization of multiple frequency resonators on a single substrate meeting the requirements for emerging multi-band mixed-frequency wireless communication applications in a small size package. Depending on the piezoelectric material of choice and the substrate material the fabrication process could vary in some steps.

However, the final structure of the resonators is usually similar independent of the process flow. It includes a piezoelectric layer deposited on top of a released (nanocrystalline) polydiamond thin film structure, sandwiched in between two metal electrodes. The metal electrodes are properly outlined to limit the excited resonance mode to a desired mode-shape. The electrodes can be designed in either one- or two-port configuration depending on the application. An intermediate silicon dioxide layer (or a similar dielectric layer) can be introduced in between the diamond and the metal/piezo/metal stack in order to reduce the temperature coefficient of frequency (TCF).

By properly designing and controlling the thickness of all layers incorporated in the device a near zero TCF is achievable. Resonators with small TCF are very important both in RF and sensory application since they eliminate the need for any active or passive temperature compensation mechanism and simplify the system level design of the product that the resonator is targeted for.

The temperature coefficient of frequency of diamond is relatively low (−12 ppm/° C.), adding more value to its application as a resonant structure. A thin layer of oxide with a large positive TCF (85 ppnV° C.) can be used for passive temperature compensation. Although, a lower acoustic velocity of the oxide film decreases the resonance frequency, it is offset by the very large acoustic velocity of diamond. Therefore, both resonance frequency and temperature stability of thin film piezoelectric-on-diamond (TPoD) resonators are superior to devices made from other structural materials such as silicon or pure piezoelectric materials. Resonators made of piezoelectric materials are discussed by G. Piazza, et al., in "Low motional resistance ring-shaped contour-made aluminum nitride piezoelectric micromechanical resonators for UHF applications." *International Conference on Micro Electro Mechanical Systems* (*MEMS '05*), 2005, pp, 20-23, for example.

Referring to the drawing figures, FIG. 1 illustrates an exemplary piezoelectric-on-diamond resonator 10, such as a ZnO-on-diamond resonator 10. The resonator 10 shown in FIG. 1 is a piezoelectrically-transduced in-plane resonant resonator 10 in a one port configuration.

Figure 2:
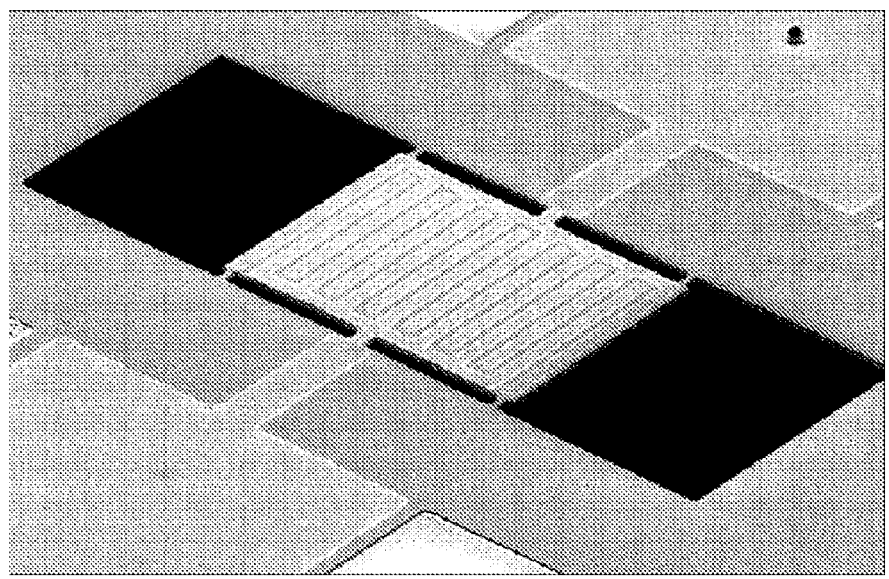
FIG. 2 is a scanning electron microscope (SEM) picture of a fabricated resonator.

FIG. 2 is a SEM picture of an exemplary reduced-to-practice resonator 10. As is shown in FIG. 2, the top electrode 17 is patterned to excite higher order lateral bulk acoustic resonance modes of the resonator 10 in a two port configuration. Patterning is illustrated in FIG. 2 by the multiple fingers comprising the top electrode 17.

The piezoelectrically-transduced resonator 10 is fabricated on a polydiamond-on-silicon substrate 11. The polydiamond-on-silicon substrate 11 comprises a lower silicon layer 12, and a diamond layer 13. The resonator structure mainly comprises of the diamond layer, an optional thin buffer layer 14 (such as silicon dioxide) covering the diamond layer 13, and an upper piezoelectric material layer 16, such as a zinc oxide (ZnO) layer 16. The polydiamond substrate 11 was chosen to increase the resonance frequency and thus provide higher quality factor in an air/liquid environment. The inherently high coupling coefficient of the piezoelectric transduction mechanism results in low motional impedances which are much easier to be interfaced with electronics. A thin silicon dioxide layer 14 is provided between the diamond and the piezoelectric layers (13 and 16 respectively) to compensate the relatively large temperature coefficient of frequency and eliminate the sensitivity of the sensor 10 to environmental temperature changes.

A schematic diagram of the process flow used to fabricate an exemplary resonator 10 is shown in FIGS. 3a and 3b. An exemplary fabrication process is as follows.

A two to three micrometer layer 13 of nanocrystalline diamond is deposited on a silicon wafer 12 in a microwave assisted chemical vapor deposition chamber at 800° C. The surface roughness of the diamond film layer 13 is directly related to the thickness and the grain size of the nanocrystalline diamond. This surface roughness is important in that a rough surface degrades the adhesion of subsequently deposited layers. Furthermore, a rough surface reduces the piezoelectric coefficient of the piezoelectric layer 16 that is subsequently deposited. The piezoelectric coefficient is reduced because the crystallographic orientation of the grains is scattered.

Thus, the surface of the nanocrystalline diamond layer 13 needs to be relatively smooth to provide optimal operating characteristics. This may be achieved by polishing the surface of the nanocrystalline diamond layer 13, for example. Optionally, and as is illustrated in FIG. 3a, a thin (<1 μm) oxide layer 14 may be deposited in a plasma enhanced chemical vapor deposition (PECVD) tool and polished back to less than 0.5 μm thickness before subsequent layers are deposited/patterned. Various other materials may be employed to smooth out the diamond layer 13. These include spin coated sol gel piezoelectric ceramic materials such as lead zirconate titanate, or the bottom metallic electrode 15, for example.

The polished oxide layer 14 has dual functionality. Firstly, it provides a smooth surface for the deposition of a high quality piezoelectric layer. Secondly, it reduces the temperature coefficient of frequency (TCF) of the resulting composite resonator structure.

A bottom metal electrode layer 15 (e.g., Cr/Au) is e-beam evaporated and pattered. The bottom metal electrode layer 15 forms a bottom electrode of the sensor 10. Then, a 0.5 μm ZnO piezoelectric layer 16 is sputtered, followed by evaporation of a top metal electrode layer 17 (e.g., Mo or Al) that forms the top electrode 17 of the sensor 10. Access holes 18 are etched in the ZnO piezoelectric layer 16 to provide access the bottom electrode 15 for wire bonds.

Trenches 19 are etched in the stack of layers down to the silicon substrate 11. To accomplish this, a relatively thick (>1 μm) PECVD oxide mask layer (not shown) is deposited and patterned, and the resonator structural stack is etched, layer by layer down to the silicon substrate 11.

The ZnO piezoelectric layer 16 may be wet-etched in an ammonium chloride solution. The oxide layer 14 and the diamond layer 13 may be dry etched using an inductively coupled plasma (ICP) tool. Oxygen plasma is used to etch the diamond layer 13.

The sensor 10 is dry released from the substrate 11 by isotropically etching the silicon layer 12 in $SF_6$ plasma, for example or etching the silicon substrate from the backside. The residue of the oxide mask layer is removed using the inductively coupled plasma (ICP) tool.

The quality of c-axis oriented ZnO film has a significant effect on the performance of the fabricated resonator 10, specifically on its motional resistance ($R_m$), through the effective piezoelectric coefficient ($d_{31}$):

$$R_m \propto \frac{1}{d_{31}^2}, \quad (1)$$

The properties of the substrate and its surface have a dominant effect on the quality of the sputtered ZnO piezoelectric layer 16. The surface roughness of the polycrystalline diamond layer 13 is directly projected to the sputtered ZnO piezoelectric layer 16, and scatters the columnar grain structure. The polished surface of the oxide layer 14 deposited on top of the diamond layer 13 compensates for the surface roughness and significantly improves the quality of the sputtered ZnO piezoelectric layer 16.

To analyze the properties of the sputtered ZnO piezoelectric layer 16, x-ray diffraction (XRD) has been used. FIG. 4 compares some of the measured 2θ XRD curves from ZnO samples sputtered on different substrates 11 with various sputtering parameters. The best quality ZnO piezoelectric layer 16 is obtained by sputtering on polished oxide at elevated temperature (350° C.), which confirms the effect of the surface roughness and the sputtering temperature on the grain orientation.

The structure of the resonator 10 is a rectangular plate excited in its lateral extensional mode. The top electrodes 17 are patterned to form an array of interdigitated fingers. This results in a two-port resonator 10 resonating in a high order lateral mode. Increasing the transduction area (number of fingers) in this design reduces the motional resistance of the device, making it suitable for RF applications. Smaller finger pitch increases the frequency of operation.

The frequency of operation and the resonance mode shape are functions of relative thicknesses of all the layers comprising the resonant structure. The fundamental resonance mode shape for a structure with L=5 μm and W=2 μm consisting of a 2 μm thick diamond layer, a 0.5 μm thick oxide layer and a 0.5 μm thick ZnO layer were simulated in FEMLAB.

The Young's modulus of the diamond layer 13 was assumed to be 1000 GPa in these simulations. It was determined from the simulated results that the oxide layer 14 reduces the resonance frequency from 1.4 GHz to 1.2 GHz and also affects the resonance mode shape. The displacement field in the device with oxide layer 14 quickly fades out from the ZnO layer 16 toward the diamond layer 13, and out-of-plane components are considerably prominent compared to the case without oxide. This can cause charge cancellation sites to develop across the electrodes 15, 17, and increases the effective motional impedance of the resonator 10.

Fabricated resonators 10 were connected to a network analyzer on a high frequency probe station using ground-signal-ground microprobes. A typical measured frequency response plot for a resonator 10 with 40 μm finger pitch excited in its third harmonic mode is shown in FIG. 5. In particular, FIG. 5 shows a frequency response plot of a $3^{rd}$ order resonator with a 40 μm finger pitch.

The measured resonance frequency is ~1.8× higher than that of an identical design fabricated on a 6 μm-thick SOI substrate 11. The same trend of frequency increase was observed for resonators 10 with smaller finger pitch. Measured resonance frequencies and quality factors from thin film piezoelectric-on-silicon (TpoS) and thin film piezoelectric-on-diamond (TpoD) resonators with various finger pitches are summarized in Table 1.,

TABLE 1

| Finger Pitch(μm) | Silicon | | Diamond | | |
|---|---|---|---|---|---|
| | f(MHz) | Q | f(MHz) | Q | Frequency ratio |
| 40 | 95 | 3000 | 174 | 1800 | 1.8 |
| 20 | 186 | 1800 | 306 | 3000 | 1.6 |
| 10 | 370 | 1000 | 565 | 1300 | 1.5 |
| 5 | 640 | 800 | 1230 | 700 | 1.9 |

Figure 6:
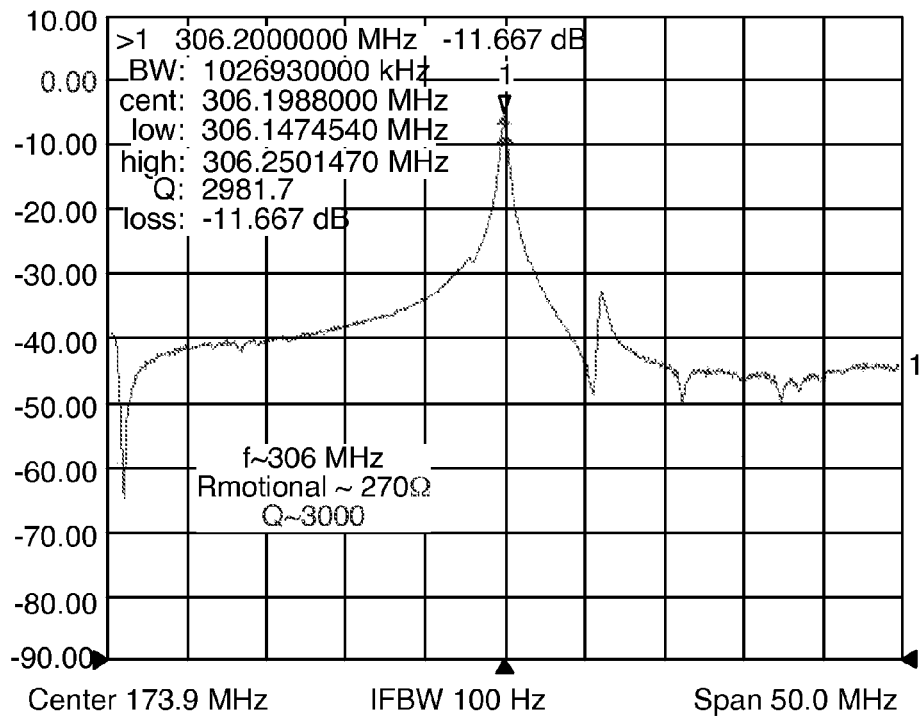
FIG. 6 shows a frequency response plot measured from a resonator with a 20 μm finger pitch.
Figure 7:
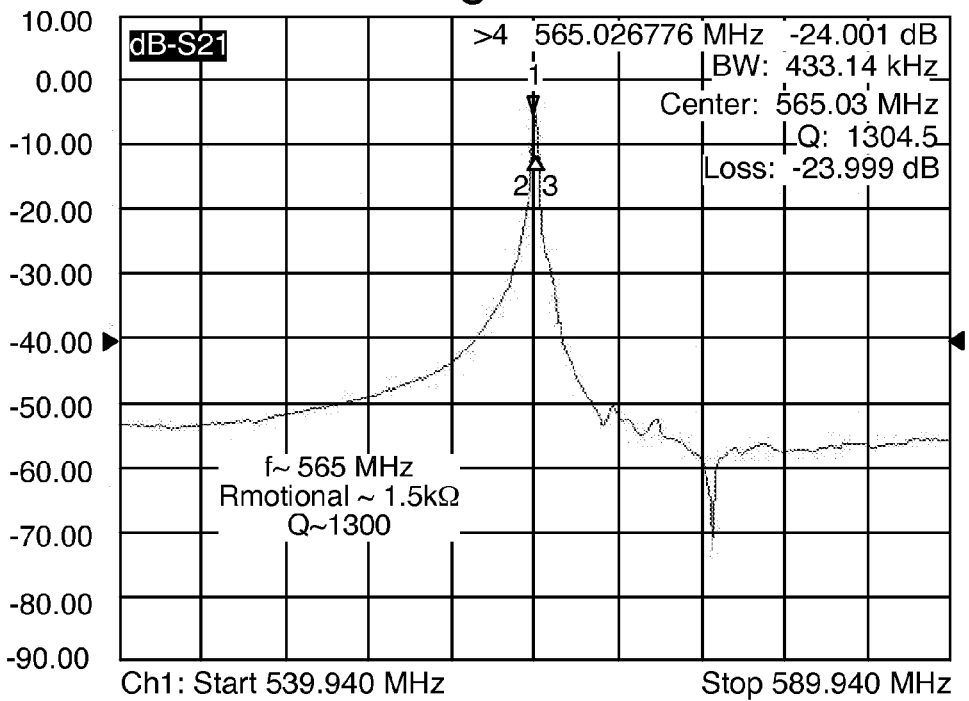
FIG. 7 shows a frequency response plot measured from a resonator with a 10 μm finger pitch.
Figure 8:
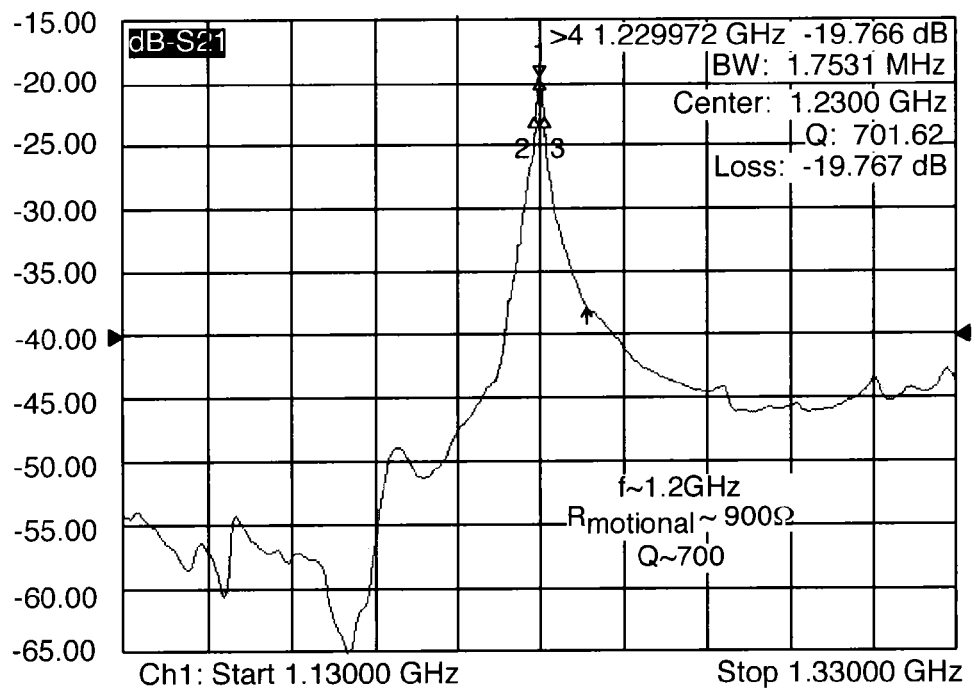
FIG. 8 shows a frequency response plot measured from a resonator with a 5 μm finger pitch exhibiting the highest measured frequency (1.23 GHz)

Since the thickness of the deposited nanocrystalline diamond layer 13 is not uniform across the substrate 11, different frequency ratios are observed for devices located at different spots on the substrate 11. The highest measured resonance frequency for each finger size is included in Table 1. Frequency response plots for exemplary thin film piezoelectric-on-diamond resonators 10 presented in Table 1 are shown in FIGS. 6-8. FIG. 6 shows a frequency response plot measured from a resonator 10 with a 20 μm finger pitch. FIG. 7 shows a frequency response plot measured from a resonator 10 with a 10 μm finger pitch. FIG. 8 shows a frequency response plot measured from a resonator 10 with a 5 μm finger pitch exhibiting the highest measured frequency (1.23 GHz).

The motional impedance of a 1.2 GHz resonator 10 was less than 1 kOhm. This is a very small impedance compared to the reported values from capacitively transduced resonators in the same range of frequency. The motional resistance of the resonator 10 may be further reduced by thinning down or removing the oxide layer 14 in the resonator structure, and by optimizing resonator dimensions for a clean mode shape.

Figure 9:
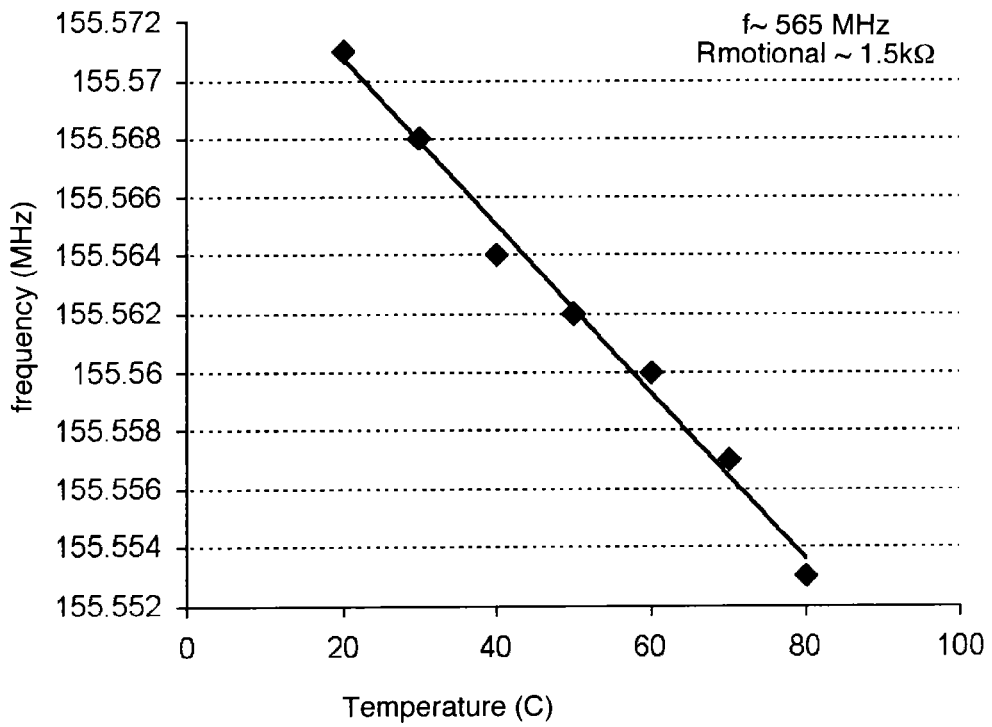
FIG. 9 shows a temperature coefficient of frequency (TCF) curve for a resonator with 40 μm finger pitch resonating at 155 MHz.

The temperature coefficient of frequency (TCF) for a resonator 10 with a 40 μm finger pitch and a resonance frequency of ~155 MHz was measured in a temperature and humidity control chamber. An exemplary TCF plot is shown in FIG. 9. The TCF of this resonator 10 was measured to be remarkably low (−2 ppm/° C.). By precisely controlling the oxide thickness, the overall TCF of these devices can potentially be engineered to a near zero value.

The above-disclosed devices may be used as RF resonators for oscillatory application, coupled resonators for RF filter application, and resonant-mass sensors for chemical, biomedical and gas detection applications. Mass sensor devices are discussed below. The use of diamond has the advantage of increased resonance frequency compared to the same size (lateral dimension) resonators 10. By introducing the oxide layer 14 in the stack of materials implemented in the resonators 10, near-zero TCF resonators can be fabricated which are of great importance in all applications.

The piezoelectric transduction mechanism provides lower motional impedance devices at high frequencies compared to capacitively transduced devices. These devices can be operated in fluids and demonstrate relatively high quality factors and low motional impedances which enables sensory application in air and liquids.

In addition to resonators 10, piezoelectric mass sensors 10a (FIG. 10) may be fabricated using the diamond-based substrate. Such piezoelectric transducers 10a may be employed for actuation and read-out of a sensor structure. In this way, the motional impedance of the sensor 10a is reduced by orders of magnitude to a range that can be comfortably interfaced with the most generic oscillator circuits. Polycrystalline diamond is used as the resonator structural material. The high elastic modulus of diamond (highest in nature) increases the frequency of operation, resulting in higher sensor sensitivity while sustaining relaxed lithographic requirements. As was mentioned previously, the TCF of a diamond resonator 10 is a relatively small value (−12 ppm/° C.) that can be compensated by incorporating a thin layer of silicon dioxide in the resonator structure.

Figure 10:
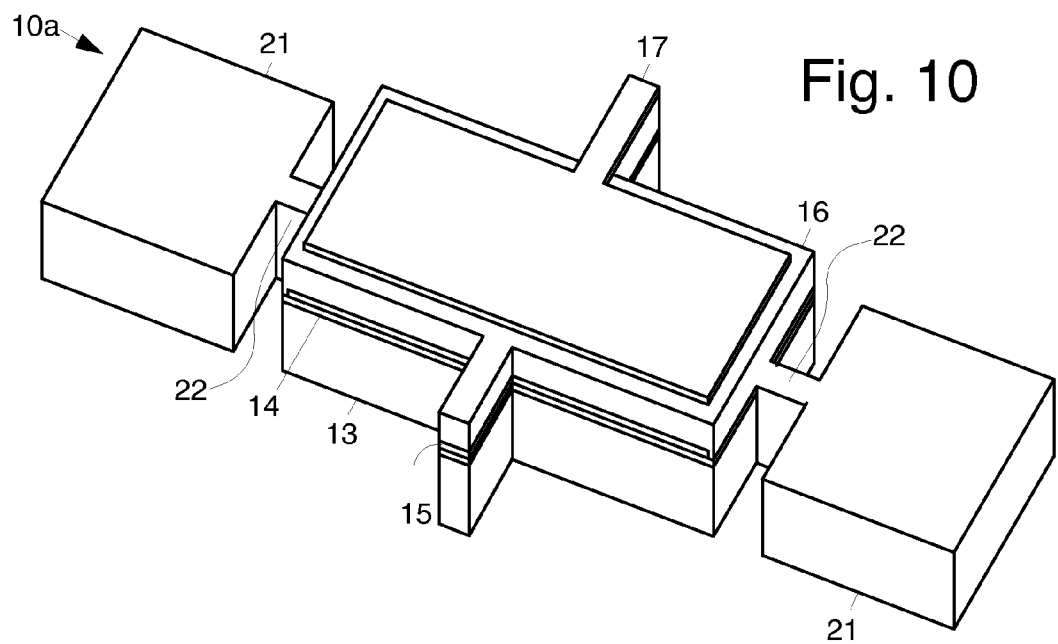
FIG. 10 illustrates an exemplary ZnO-on-diamond mass sensor.

The processing discussed with reference to FIGS. 3a and 3b may be used to fabricate thin film piezoelectric-on-diamond mass sensors 10a. FIG. 10 illustrates an exemplary ZnO-on-diamond mass sensor 10a.

In general, as shown in FIG. 10, the resonant structure comprises a central block comprising a resonator 10 as previously described, and two annexed sensing platforms 21 attached to it via separation beams 22. This design is utilized to minimize the change in the effective stiffness of the resonator 10 when an extra mass is absorbed to the sensing platforms 21.

More particularly, the sensor 10a is a piezoelectrically-transduced in-plane resonant mass sensor 10a that is fabricated on a polydiamond-on-silicon substrate 11. The resonator structure mainly comprises a lower silicon layer 12, an intermediate diamond layer 13, and an upper piezoelectric layer 16, such as a zinc oxide (ZnO) layer 16. The diamond substrate 11 was chosen to increase the resonance frequency and to provide higher quality factor in an air/liquid environment. The inherently high coupling coefficient of the piezoelectric transduction mechanism results in low motional impedances which are much easier to be interfaced with electronics. A thin silicon dioxide layer 14 may be provided between the diamond and the piezoelectric layers (13 and 16 respectively) to compensate the relatively large temperature coefficient of frequency and eliminate the sensitivity of the sensor 10 to environmental temperature changes.

The structural material (polycrystalline diamond in this case) is coated with a thin piezoelectric layer 16 (ZnO). The piezoelectric layer 16 covering the central block is sandwiched between top and bottom metal electrodes (17 and 15 respectively). The top electrode 17 can be split into two separate electrodes for two-port operation of the sensor 10. However, by doing so, the available actuation/sense area is reduced to half, increasing the motional impedance of the resonator. The ZnO layer 16 can be removed or kept intact on the sensing platforms 21.

An alternating electrical field applied across the ZnO layer 16 introduces an in-plane strain field through the $d_{31}$ piezoelectric coefficient of ZnO. When the frequency of the applied electrical signal matches the lateral bulk-extensional resonance mode of the structure, the vibration amplitude and the current passing through the electrodes are maximized.

By increasing the stiffness of the resonator structural material (diamond) while keeping the effective mass almost constant, the natural frequency and hence the sensitivity of the sensor 10a, are increased. However, this may not result in a better mass detection resolution since other factors such as Q of the resonator and electrical noise of the interface circuit will also contribute to the overall resolution of the sensor 10a.

The performance of the mass sensor 10a was simulated. The first length-extensional resonance mode of a device with 70 μm long central-block (resonator 10) and 30 μm long sensing platform 22 was simulated in FEMLAB.

A resonance frequency of 36 MHz was predicted for a structure made of diamond, oxide and ZnO with 2.5/0.5/0.5 μm thicknesses, respectively. The separation beams 22 undergo the highest deformation in the structure and the two sensing platforms 21 mostly experience a translational motion. The maximum vibration amplitude of the sensing platform 21 improves the mass sensitivity while minimizing changes in the stiffness resulting from absorbed mass.

To predict the sensitivity of the sensor 10a, an extra piece of mass in the shape of a thin (0.5 μm) cylinder with a radius of 4 μm was added on top of the sensing platform 21. The density of the material that the cylinder is made of was altered gradually and resonance frequency simulated each time. A mass sensitivity of 1100 Hz/pg was predicted for the length-extensional resonance mode of the mass sensor 10a.

The frequency response of the fabricated sensor 10a was measured using an E5071B Agilent network analyzer after wirebonding the sensor 10a to a custom-made printed circuit board. Extra mass in the shape of a cylinder (made of Pt) was deposited on the device sensing platform 21 using a focused ion beam (FIB) tool. By using FIB, desirable amount of mass can be deposited on the sensor 10a without damaging its functionality.

Figure 11:
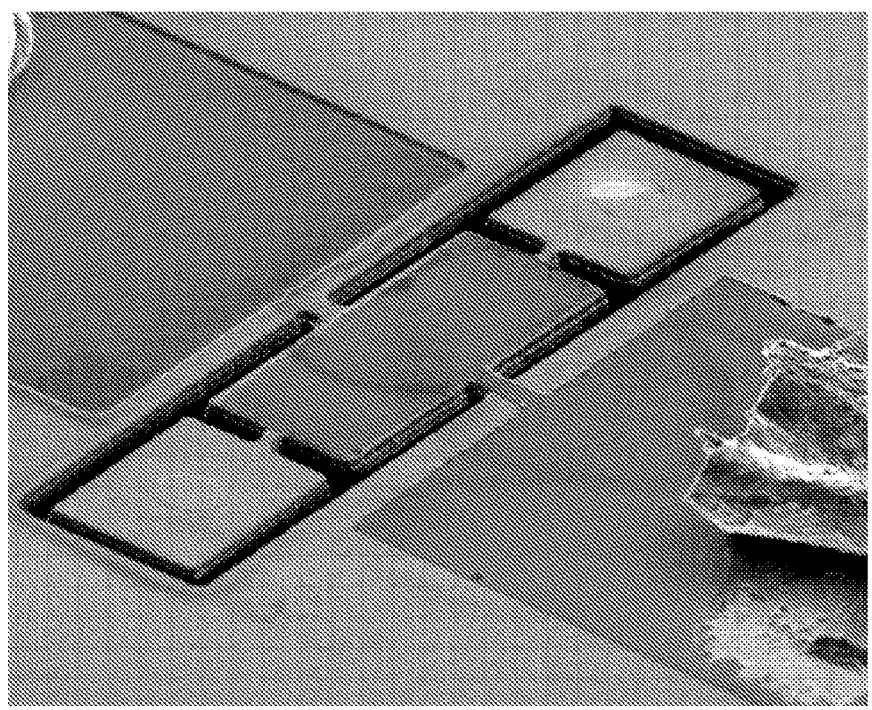
FIG. 11 is a SEM picture of a exemplary ZnO-on-diamond mass sensor after Focused Ion Beam (FIB) platinum deposition.

FIG. 11 shows an SEM view of a fabricated sensor 10a after deposition of Pt on the sensing platforms 21. Platinum deposition was performed on four experimental sensors 10a. The radius of the platinum cylinder was kept constant for all sensors 10a and the thickness was increased from 100 to 150, 200 and 300 nm. The amount of the added mass was calculated by multiplying the approximate cylinder volume with the density of material. Since the deposited material by FIB was not 100% Pt and contains a large amount of carbon and other materials (~50%), the density of platinum was used for half of the volume and it was assumed that the rest of the volume was filled with carbon.

Figure 12:
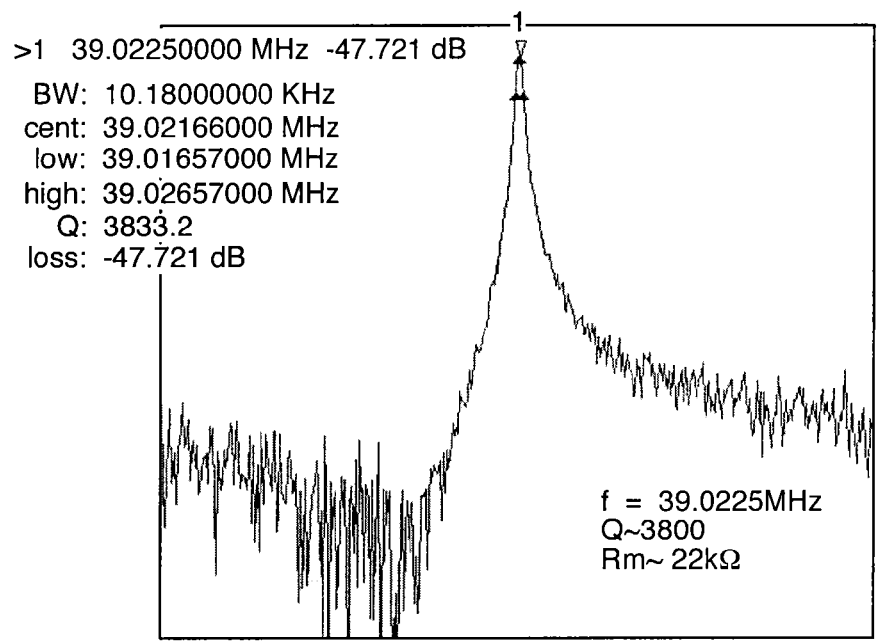
FIGS. 12 and 13 respectively show resonance response of a lateral resonant mass sensor before and after ~48 μg platinum deposition.
Figure 13:
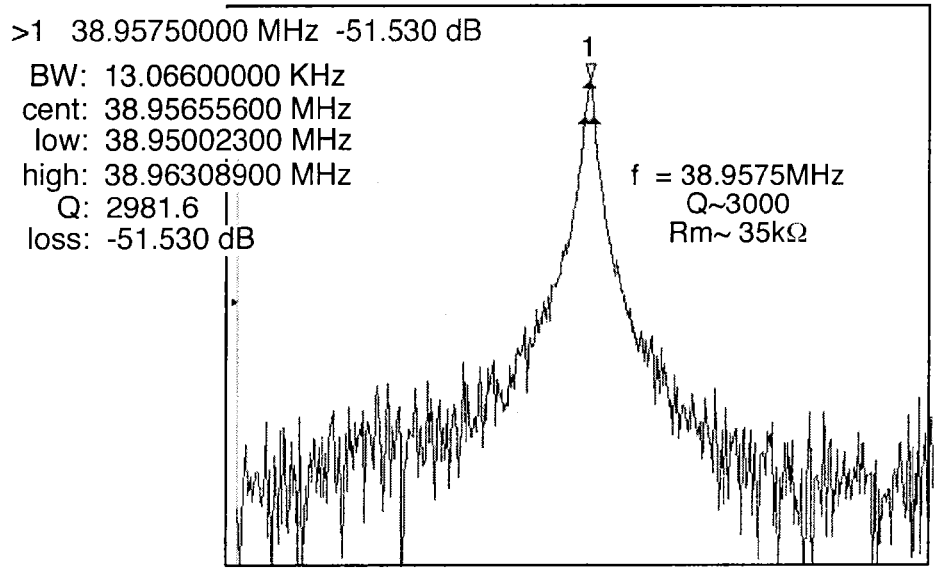

After deposition of platinum, sensors 10a were wirebonded and the resonance frequency was measured. FIGS. 12 and 13 respectively show the measured frequency response of a sensor 10a with 70 μm long central block and 30 μm long sensing platform 21, before, and after ~48 pg platinum deposition.

Figure 14:
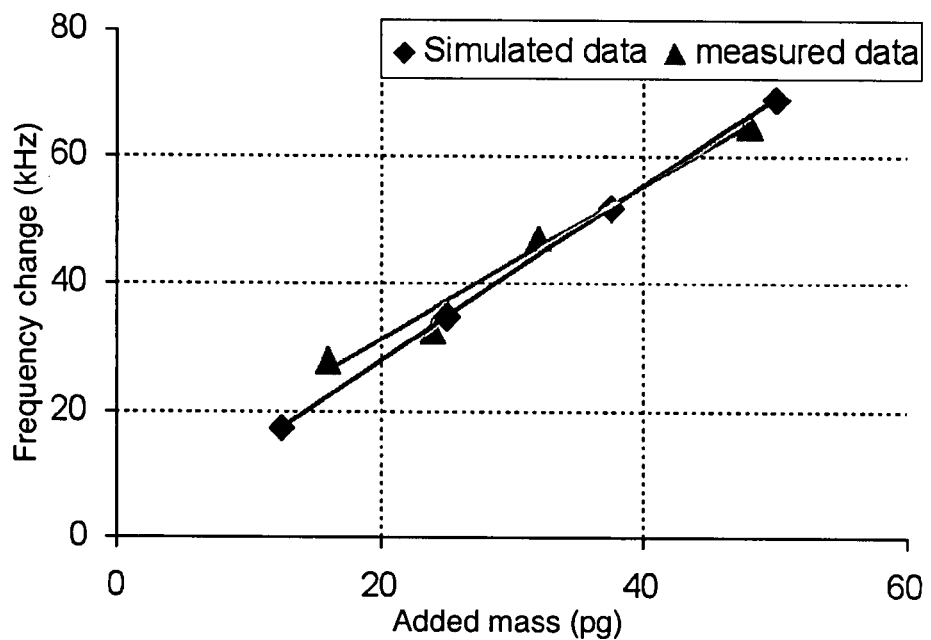
FIG. 14 shows a comparison between simulated and measured sensitivity for 39 MHz and 111 MHz frequency resonance modes of an exemplary ZnO-on-diamond mass sensor.

The resonance frequency is reduced by ~65 kHz after Pt deposition. The motional impedance of the sensor 10a was measured to be in 20 kΩ range with quality factor values >3500, at ~40 MHz in air (before Pt deposition). The frequency change as a function of the mass deposited on the sensor 10a was compared to the theoretical values predicted by FEMLAB and is shown in FIG. 14. Sensitivity of ~1 kHz/pg is measured for the 39 MHz devices, which is in good agreement with the simulated values.

Figure 15:
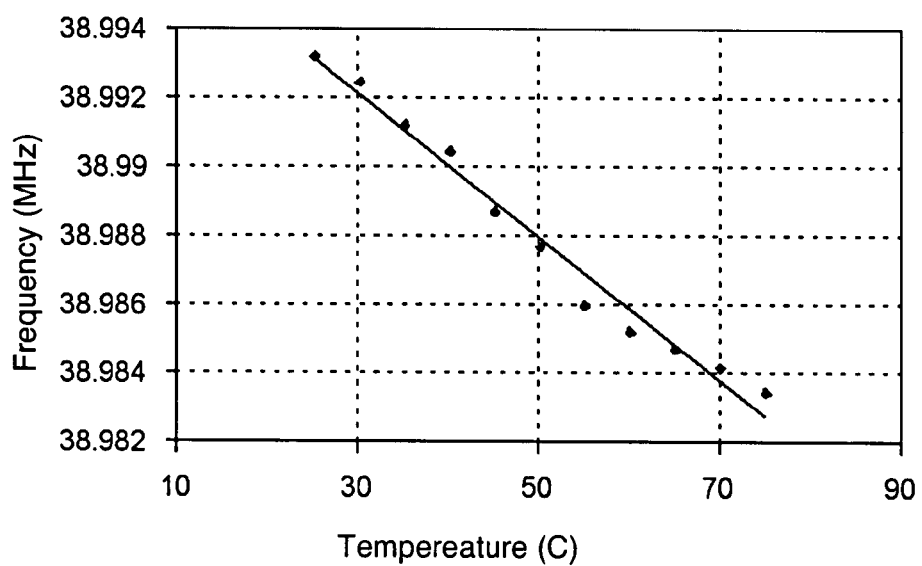
FIG. 15 shows measured TCF for an exemplary ZnO-on-diamond mass sensor.

The TCF for the sensor 10a was measured using a temperature/humidity control chamber. Sensors 10a with thicker oxide exhibited lower TCF values (and lower resonance frequencies as well). The resulted data points for a resonator with a resonance frequency of ~39 MHz are plotted in FIG. 15, showing a TCF value of ~−6 ppm/° C. for the sensor 10a.

In order to further reduce the motional impedance of the resonant mass sensor 10a the width of the sensor 10a can be increased, which has very little contribution in the resonance frequency while it increases the electrode area and lowers the impedance.

Thus, piezoelectrically-transduced polydiamond micromachined resonators have been disclosed that may be used in RF oscillator, filter and mass sensor applications. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. An acoustic resonator apparatus, comprising:
a diamond layer disposed on a substrate;
a piezoelectric layer disposed on the diamond layer; and
top and bottom electrodes sandwiching the piezoelectric layer;
wherein the diamond layer, the piezoelectric layer and the electrodes comprise a stack that is laterally and vertically released from the substrate to form a lateral extensional mode resonator that is free to vibrate relative to the substrate.

2. The apparatus recited in claim 1 wherein the substrate comprises silicon.

3. The apparatus recited in claim 1 wherein the resonator is a bulk acoustic resonator.

4. The apparatus recited in claim 1 wherein the resonator is a bulk acoustic resonator operating in its thickness, width or length extensional mode.

5. The apparatus recited in claim 1 wherein the substrate comprises silicon and silicon dioxide.

6. The apparatus recited in claim 1 wherein the diamond layer comprises a chemical vapor deposited polycrystalline diamond layer.

7. The apparatus recited in claim 1 further comprising a polished layer disposed between the diamond layer and the piezoelectric layer.

8. The apparatus recited in claim 7 wherein the polished layer compensates for the temperature coefficient of frequency of the other layers existing in the resonator composite structure.

9. The apparatus recited in claim 7 wherein the polished layer is silicon dioxide.

10. The apparatus recited in claim 1 wherein the piezoelectric layer comprises zinc oxide.

11. The apparatus recited in claim 1 wherein the piezoelectric layer comprises aluminum nitride.

12. The apparatus recited in claim 1 wherein the piezoelectric layer comprises a piezoelectric ceramic material.

13. The apparatus recited in claim 12 wherein the piezoelectric ceramic material comprises lead zirconate titanate.

14. The apparatus recited in claim 1 wherein the electrodes comprise a low resistivity metal.

15. The apparatus recited in claim 14 wherein the low resistivity metal is selected from a group including Au, Al, Pt, and Mo.

16. The apparatus recited in claim 14 wherein the low resistivity metal is deposited on either a Cr or a Ti adhesion layer.

17. The apparatus recited in claim 1 wherein the top and bottom electrodes are patterned.

18. The apparatus recited in claim 1 wherein the top electrode is patterned to provide for a two-port resonator.

19. The apparatus recited in claim 1 wherein the top electrode is patterned to excite higher order lateral bulk acoustic resonance modes of the resonant structure.

20. The apparatus recited in claim 1 further comprising one or more sensing platforms coupled to the stack to form a mass sensor.

21. The apparatus recited in claim 17 which comprises a gravimetric bio/chemical sensor.

22. The apparatus recited in claim 1 which comprises a plurality of resonator apparatus coupled together to realize a filter for RF applications.

23. The apparatus recited in claim 18 wherein the resonators are acoustically coupled.

24. The apparatus recited in claim 18 wherein the resonators are electrically coupled.

* * * * *

UNITED STATES PATENT AND TRADEMARK OFFICE
CERTIFICATE OF CORRECTION

| | | |
|---|---|---|
| PATENT NO. | : 7,812,692 B2 | Page 1 of 1 |
| APPLICATION NO. | : 11/809748 | |
| DATED | : October 12, 2010 | |
| INVENTOR(S) | : Ayazi et al. | |

It is certified that error appears in the above-identified patent and that said Letters Patent is hereby corrected as shown below:

Column 4, line 39, after "is" delete "patternened" and replace with --patterned--.

Signed and Sealed this
Twenty-fifth Day of January, 2011

David J. Kappos
*Director of the United States Patent and Trademark Office*